United States Patent
Yeh et al.

(10) Patent No.: US 10,283,196 B2
(45) Date of Patent: May 7, 2019

(54) DATA WRITING METHOD, MEMORY CONTROL CIRCUIT UNIT AND MEMORY STORAGE APPARATUS

(71) Applicant: PHISON ELECTRONICS CORP., Miaoli (TW)

(72) Inventors: Chih-Kang Yeh, Kinmen County (TW); Po-Yung Chang, Yilan County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 245 days.

(21) Appl. No.: 15/238,715

(22) Filed: Aug. 16, 2016

(65) Prior Publication Data
US 2017/0365334 A1    Dec. 21, 2017

(30) Foreign Application Priority Data
Jun. 17, 2016   (TW) .............................. 105119063 A

(51) Int. Cl.
*G06F 12/00*     (2006.01)
*G11C 11/56*     (2006.01)
*G06F 3/06*      (2006.01)

(52) U.S. Cl.
CPC ........ *G11C 11/5635* (2013.01); *G06F 3/0604* (2013.01); *G06F 3/065* (2013.01); *G06F 3/0638* (2013.01); *G06F 3/0659* (2013.01); *G06F 3/0688* (2013.01); *G11C 11/5628* (2013.01)

(58) Field of Classification Search
None
See application file for complete search history.

(56) References Cited

U.S. PATENT DOCUMENTS

| | | | | |
|---|---|---|---|---|
| 2009/0327591 | A1* | 12/2009 | Moshayedi | G06F 11/1441 711/103 |
| 2016/0085612 | A1* | 3/2016 | Liu | G06F 11/0793 714/6.13 |
| 2016/0364337 | A1* | 12/2016 | Hale | G06F 12/0897 |

FOREIGN PATENT DOCUMENTS

| | | |
|---|---|---|
| TW | 201317779 | 5/2013 |
| TW | 201612751 | 4/2016 |

OTHER PUBLICATIONS

"Office Action of Taiwan Counterpart Application", dated Mar. 16, 2017, p. 1-p. 6.

* cited by examiner

*Primary Examiner* — Baboucarr Faal
(74) *Attorney, Agent, or Firm* — JCIPRNET

(57) ABSTRACT

A data writing method for a rewritable non-volatile memory module is provided. The method includes grouping physical erasing units of a rewritable non-volatile memory module at least into a first area and a second area, wherein the second area is programmed with a single-page programming mode and the first area is programmed with a multi-page programming mode. The method further includes receiving first data; and determining whether the number of a physical erasing unit having only part of physical programming units being programmed among the physical erasing units of the first area is less than a predetermined value, and if yes, writing the first data into the physical erasing units of the second area.

22 Claims, 13 Drawing Sheets

| Lower physical programming unit | Center physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 | ns
DATA WRITING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 105119063, filed on Jun. 17, 2016. The entirety of the above-mentioned patent application is hereby incorporated by reference herein and made a part of this specification.

BACKGROUND

Technical Field

The present invention relates to a data writing method, and more particularly, to a data writing method for a rewritable non-volatile memory module and a memory control circuit unit and a memory storage apparatus using such method.

Description of Related Art

The growth of digital cameras, mobile phones, and MP3 players has been rapid in recent years. Consequently, the consumers' demand for storage media has increased tremendously. A rewritable non-volatile memory is one of the most adaptable memories for portable electronic products such as laptop computer due to its data non-volatility, low power consumption, small volume, non-mechanical structure and high read/write speed. A solid state drive (SSD) is a memory storage apparatus which utilizes a flash memory module as a storage medium. For these reasons, the flash memory has become an import part of the electronic industries.

In a NAND flash memory module, physical programming units are constituted by a plurality of memory cells arranged on the same word line. Based on the number of bits that can be stored by each memory cell, the NAND flash memory module may be classified into a SLC (Single Level Cell) NAND flash memory module, an MLC (Multi Level Cell) NAND flash memory module and a TLC (Trinary Level Cell) NAND flash memory module. Among them, each memory cell of the SLC NAND flash memory module can store one data bit (i.e., "1" and "0"), each memory cell of the MLC NAND flash memory module can store two data bits, and each memory cell of the TLC NAND flash memory module can store three data bits.

Because each memory cell of the SLC NAND flash memory module can store one data bit, the memory cells arranged on the same word line are corresponding to one physical programming unit in the SLC NAND flash memory module.

In comparison with the SLC NAND flash memory module, a floating gate storage layer of each memory cell of the MLC NAND flash memory module can store two data bits, where each of storage states (i.e., "11", "10", "01" and "00") includes a LSB (Least Significant Bit) and a MSB (Most Significant Bit). For instance, a value of a first bit counted from the left is the LSB, and a value of a second bit counted from the left is the MSB in the storage states. Accordingly, the memory cells arranged on the same word line can constitute two physical programming units. Among them, the physical programming units composed constituted by the LSB of said memory cells are known as a lower physical programming unit and the physical programming units constituted by the MSB of said memory cells are known as an upper physical programming unit. Particularly, the data stored in the lower physical programming unit may be lost due to failures occurred in programming of the upper physical programming unit.

Similarly, each memory cell in the TLC NAND flash memory module can store three data bits, where each of storage states (i.e., "111", "110", "101", "100", "011", "010", "001" and "000") includes a first bit counted from the left being the LSB, a second bit counted from the left being a CSB (Center Significant Bit) and a third bit counted from the left being the MSB. Accordingly, the memory cells arranged on the same word line can constitute three physical programming units. Among them, the physical programming units constituted by the LSBs of said memory cells are known as a lower physical programming unit, the physical programming units constituted by the CSBs of said memory cells are known as a center physical programming unit, and the physical programming units constituted by the MSBs of said memory cells are known as an upper physical programming unit. Particularly, in the TLC NAND flash memory module, in order to ensure a stable storage for the data on one word line, it is required to complete programming that word line three times. For example, after the memory cells on a first word line is programmed the first time, the memory cells on the first word line are in a first state. While programming the memory cells on a second word line, the memory cells on the first word line will be programmed again. At the time, the memory cells on the first word line are in a foggy state. Then, while programming the memory cells on a third word line, the memory cells on the first and second word lines will be programmed again. At the time, the memory cells on the first word line are in a fine state. Furthermore, while programming the memory cells on a fourth word line, the memory cells on the second and third word lines will be programmed again. At the time, the memory cells on the second word line are in the fine state. Only by doing so can the stable storage ensured for the data in the memory cells on the first word line.

Generally, in a memory storage apparatus using the TLC NAND flash memory, a memory control circuit unit groups a part of the physical erasing units therein into a temporary area, and operates the physical erasing units grouped into the temporary area with a single-page programming mode (i.e., storing one data bits per one memory cell), so as to simulate operations of the SLC NAND flash memory to thereby increase a writing speed. However, in consideration of storage capacity, most of the physical erasing units in the TLC NAND flash memory are still operated with a multi-page programming mode (i.e., storing three data bits per one memory cell). Nonetheless, a lifetime of the physical erasing unit operated with the multi-page programming mode is relatively shorter, and its speed for writing data is also slower as compared with that of physical erasing unit operated with the single-page programming mode.

Based on the above, it is one of the major subjects in the industry as how to increase a reliability and a speed for programming of the TLC NAND flash memory.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention provides a data writing method, a memory control circuit unit and a memory storage apparatus, which are capable of effectively improving the speed and the reliability for programming data.

An exemplary embodiment of the present invention provides a data writing method for a rewritable non-volatile memory module. The rewritable non-volatile memory module includes a plurality of physical erasing units. The physical erasing units are grouped at least into a first area and a second area. The number of data bits stored by each memory cell in the physical erasing units of the second area is less than the number of data bits stored by each memory cell in the physical erasing units of the first area. The data writing method includes: receiving first data, determining whether the number of a physical erasing unit having only part of physical programming units being programmed among the physical erasing units of the first area is less than a predetermined value, and writing the first data into at least one physical erasing unit of the second area if the number of the physical erasing unit having only part of physical programming units being programmed among the physical erasing units of the first area is not less than the predetermined value.

A memory control circuit unit is provided according to an exemplary embodiment of the present invention, which includes a host interface, a memory interface and a memory management circuit. The host interface is configured to couple to a host system. The memory interface is configured to couple to the rewritable non-volatile memory module, wherein the rewritable non-volatile memory module includes a plurality of physical erasing units. The memory management circuit is coupled to the host interface and the memory interface. The memory management circuit is configured to group the physical erasing units at least into a first area and a second area. The number of data bits stored by each memory cell in the physical erasing units of the second area is less than the number of data bits stored by each memory cell in the physical erasing units of the first area. The memory management circuit is further configured to receive first data, determine whether the number of a physical erasing unit having only part of physical programming units being programmed among the physical erasing units of the first area is less than a predetermined value, and write the first data into at least one physical erasing unit among the physical erasing units of the second area if the number of the physical erasing unit having only part of physical programming units being programmed among the physical erasing units of the first area is not less than the predetermined value.

An exemplary embodiment of the invention provides a memory storage apparatus, which includes: a connection interface unit configured to connect to a host system, aforesaid rewritable non-volatile memory module and aforesaid memory control circuit unit.

An exemplary embodiment of the invention provides a data writing method for a rewritable non-volatile memory module. The rewritable non-volatile memory module includes a plurality of physical erasing units. The physical erasing units are grouped at least into a first area and a second area. The number of data bits stored by each memory cell in the physical erasing units of the second area is less than the number of data bits stored by each memory cell in the physical erasing units of the first area. The data writing method includes: receiving first data, writing the first data into one physical erasing unit among the physical erasing units of the first area without taking a pathway via the second area if the number of a physical erasing unit having only part of physical programming units being programmed among the physical erasing units of the first area is less than a predetermined value, and writing the first data into at least one physical erasing unit of the second area if the number of the physical erasing unit having only part of physical programming units being programmed among the physical erasing units of the first area is not less than the predetermined value.

An exemplary embodiment of the invention provides a memory storage apparatus, which includes: a connection interface unit configured to connect to a host system, a rewritable non-volatile memory module and a memory control circuit unit. The memory control circuit unit is configured to receive first data. The memory control circuit unit is further configured to write the first data into one physical erasing unit among the physical erasing units of the first area without taking a pathway via the second area if the number of a physical erasing unit having only part of physical programming units being programmed among the physical erasing units of the first area is less than a predetermined value. Further, the memory control circuit unit is further configured to write the first data into at least one physical erasing unit among the physical erasing units of the second area if the number of the physical erasing unit having only part of physical programming units being programmed among the physical erasing units of the first area is not less than the predetermined value.

Based on the above, the data writing method, the memory control circuit unit and the memory storage apparatus according to the exemplary embodiments of the invention are capable of controlling the number of the physical erasing units serving as the storage area active unit. As a result, the speed and the reliability for programming data may be effectively improved.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
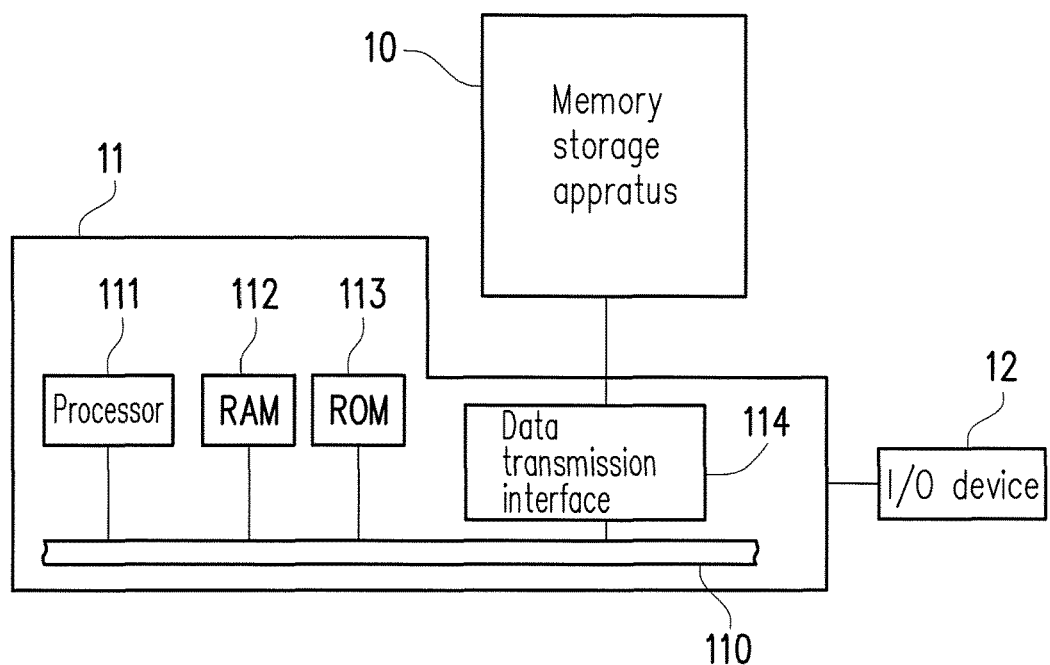
FIG. 1 is a schematic diagram illustrating a host system, a memory storage apparatus and an input/output (I/O) device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (also known as a memory storage system) includes a rewritable non-volatile memory module and a controller (also known as a control circuit unit). The memory storage apparatus is usually configured together with a host system so the host system may write data into the memory storage apparatus or read data from the memory storage apparatus.

Figure 2:
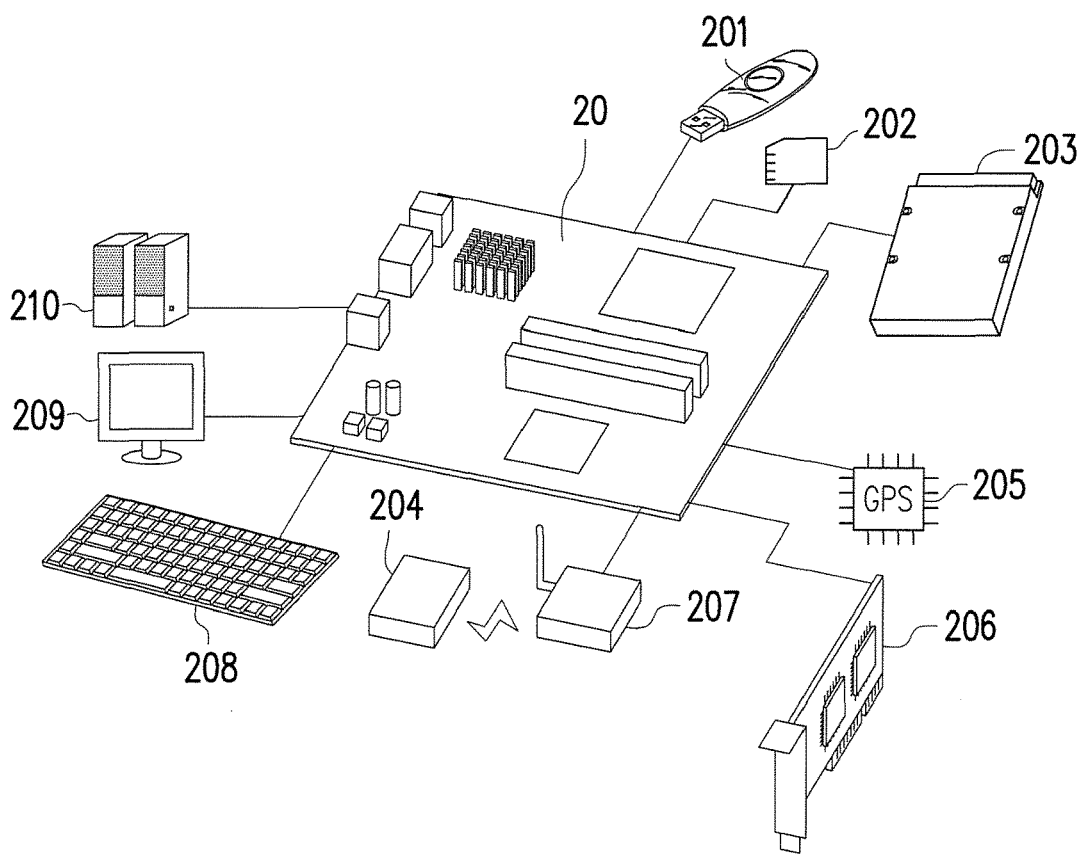
FIG. 2 is a schematic diagram illustrating a host system, a memory storage apparatus and an input/output (I/O) device according to another exemplary embodiment.

FIG. 1 is a schematic diagram illustrating a host system, a memory storage apparatus and an input/output (I/O) device according to one exemplary embodiment. FIG. 2 is a schematic diagram illustrating a host system, a memory storage apparatus and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage apparatus 10 through the data transmission interface 114. For example, the host system 11 may write data into the memory storage apparatus 10 or read data from the memory storage apparatus 10 through the data transmission interface 114. Further, the host system 11 is coupled to an I/O device 12 through the system bus 110. For example, the host system 11 can transmit output signals to the I/O device 12 or receive input signals from the I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication Storage) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 may access the wireless memory storage apparatus 204 through the wireless transmission device 207.

Figure 3:
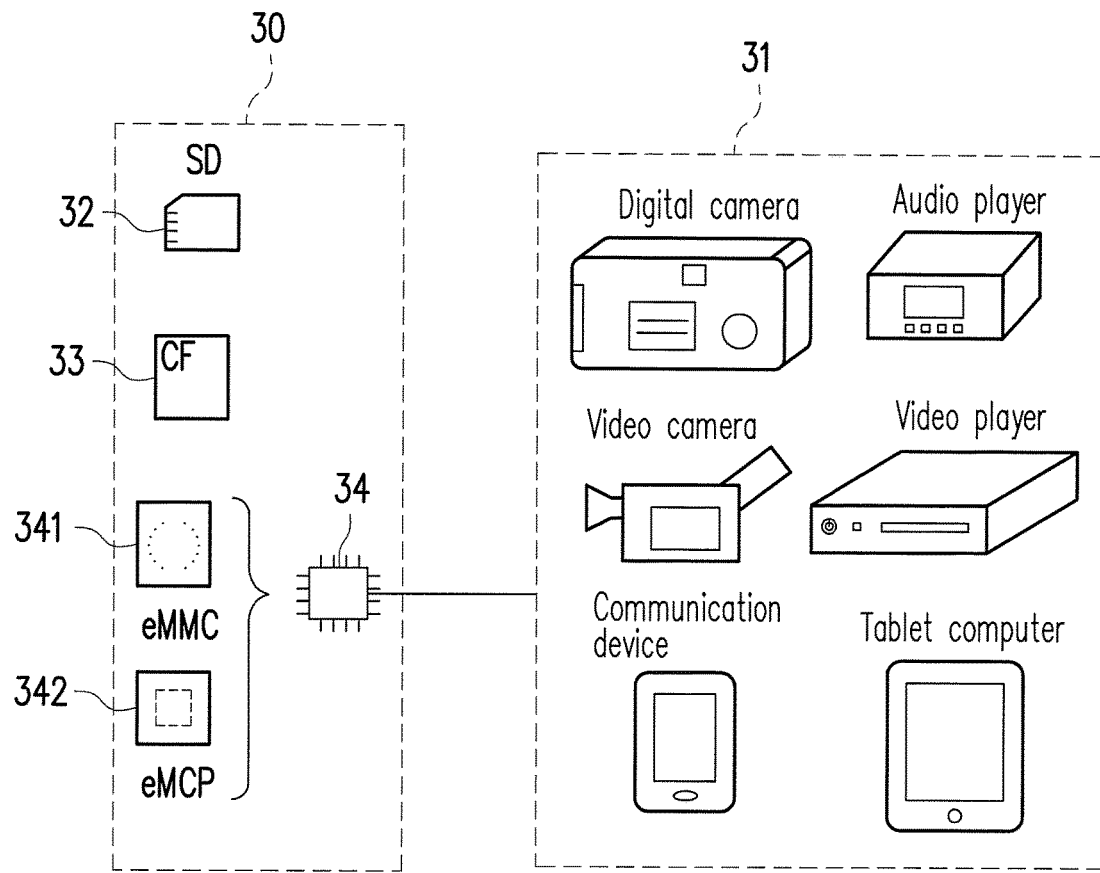
FIG. 3 is a schematic diagram illustrating a host system and a memory storage apparatus according to another exemplary embodiment.

In an exemplary embodiment, aforementioned host system may be any system capable of substantially cooperating with the memory storage apparatus for storing data. Although the host system is illustrated as a computer system in foregoing exemplary embodiment, however, FIG. 3 is a schematic diagram illustrating a host system and a memory storage apparatus according to another exemplary embodiment. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory storage apparatuses used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
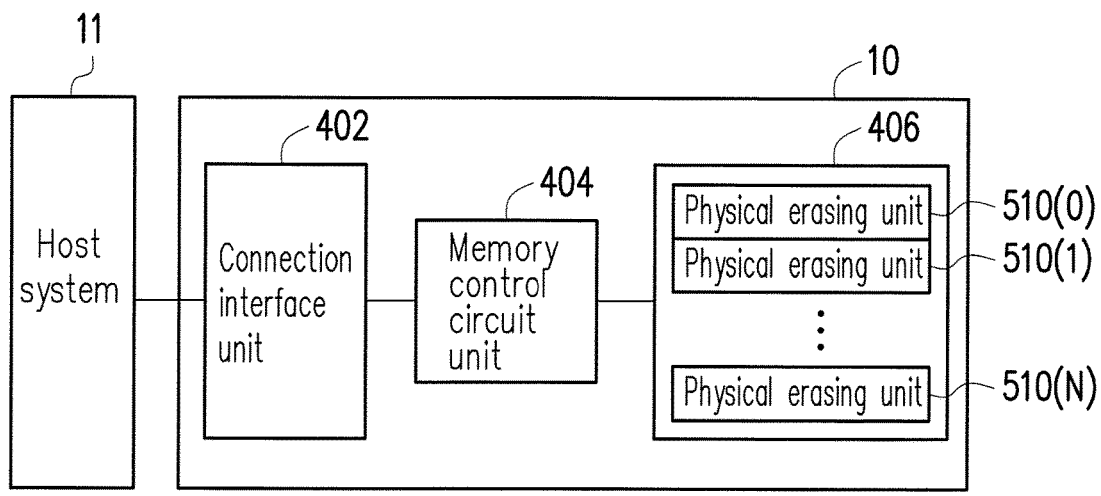
FIG. 4 is a schematic block diagram illustrating a host system and a memory storage apparatus according to an exemplary embodiment.

FIG. 4 is a schematic block diagram illustrating a host system and a memory storage apparatus according to an exemplary embodiment.

Referring to FIG. 4, the memory storage apparatus 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a SD (Secure Digital) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory storage module 406 includes multiple physical erasing units 510(0) to 510(N). For example, the physical erasing units 510(0) to 510(N) may belong to the same memory die or belong to different memory dies. Each physical erasing unit has a plurality of physical programming units, and the physical programming units of the same physical erasing unit may be written separately and erased simultaneously. Nevertheless, it should be understood that the disclosure is not limited thereto. Each physical erasing unit may be constituted by 64 physical programming units, 256 physical programming units or any amount of the physical programming units.

More specifically, the physical erasing unit is the minimum unit for erasing. Namely, each physical erasing unit contains the least number of memory cells to be erased together. The physical programming unit is the minimum unit for programming. That is, the physical programming unit is the minimum unit for writing data. Each physical programming unit usually includes a data bit area and a redundant bit area. The data bit area having multiple physical access addresses is used to store user data, and the redundant bit area is used to store system data (e.g., control information and error checking and correcting code). In the present exemplary embodiment, each data bit area of the physical programming unit contains 8 physical access addresses, and the size of each physical access address is 512 byte. However, in other exemplary embodiments, the data bit area may also contain more or less physical access addresses, and the number and size of the physical access addresses are not limited by the invention. For example, in an exemplary embodiment, the physical erasing unit is a physical block, and the physical programming unit is a physical page or a physical sector, but the invention is not limited thereto.

In the present exemplary embodiment, the rewritable non-volatile memory module 406 is a TLC (Trinary Level Cell) NAND flash memory module (i.e., a flash memory module capable of storing three data bits in one memory cell). However, the invention is not limited thereto. The rewritable non-volatile memory module 406 may also be an MLC (Multi Level Cell) NAND flash memory module (i.e., a flash memory module capable of storing two data bits in one memory cell) or other memory modules having the same features.

Figures 5A, 5B:
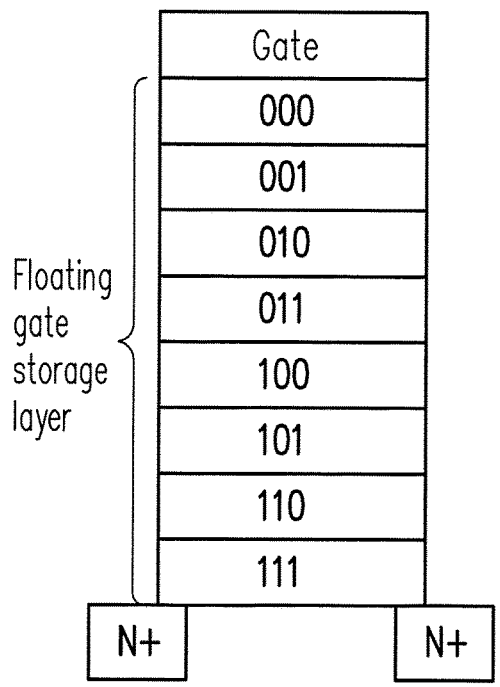
FIG. 5A and FIG. 5B are schematic diagrams illustrating a memory cell storage structure and a physical erasing unit according to an exemplary embodiment.

FIG. 5A and FIG. 5B are schematic diagrams illustrating a memory cell storage structure and a physical erasing unit according to the present exemplary embodiment.

Referring to FIG. 5A, each storage state of each memory cell in the rewritable non-volatile memory module 406 can be identified as "111", "110", "101", "100", "011", "010", "001" or "000" (as shown in FIG. 5A). The first bit counted from the left side of the storage state is the LSB, the second bit counted from the left side of the storage state is the CSB and the third bit counted from the left side of the storage state is the MSB. In addition, the memory cells arranged on the same word line can constitute three physical programming units. Among them, the physical programming units constituted by the LSBs of said memory cells are known as a lower physical programming unit, the physical programming units constituted by the CSBs of said memory cells are known as a center physical programming unit, and the physical programming units constituted by the MSBs of said memory cells are known as an upper physical programming unit.

Referring to FIG. 5B, one physical erasing unit is constituted by a plurality of physical programming unit groups. Each of the physical programming unit groups includes the lower physical programming unit, the center physical programming unit and the upper physical programming unit constituted by multiple memory cells arranged on the same word line. For example, in the physical erasing unit, the $0^{th}$ physical programming unit belonging to the lower physical programming unit, the $1^{st}$ physical programming unit belonging to the center physical erasing unit and the $2^{nd}$ physical programming unit belonging to the upper physical programming unit are regarded as one physical programming unit group. Similarly, the $3^{rd}$, the $4^{th}$, and the $5^{th}$ physical programming units are regarded as one physical programming unit group, and by analogy, the other physical programming units are also grouped into multiple physical programming unit groups by the same method. In other words, in the exemplary embodiment of FIG. 5, the physical erasing unit includes 258 physical programming units in total, and the lower physical programming unit, the center physical programming unit and the upper physical programming unit constituted by multiple memory cells arranged on the same word line can constitute one physical programming unit group. Therefore, the physical erasing unit of FIG. 5 may be divided into 86 physical programming unit groups in total. However, it should be noted that, the invention is not intended to limit the numbers of the physical programming unit or the physical programming unit groups in the physical erasing unit.

Figure 6:
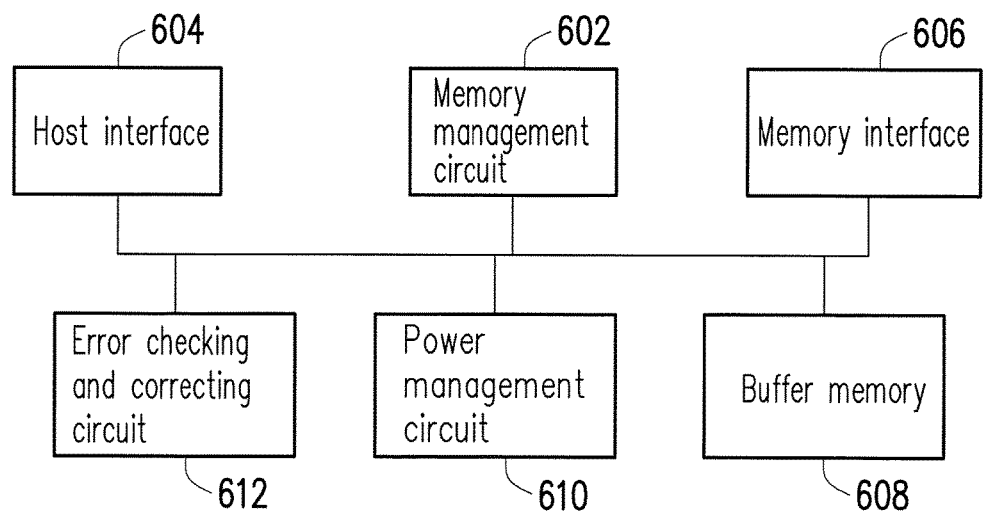
FIG. 6 is a schematic block diagram illustrating a memory control circuit unit according to an exemplary embodiment.

FIG. 6 is a schematic block diagram illustrating a memory control circuit unit according to an exemplary embodiment.

Referring to FIG. 6, the memory control circuit unit 404 includes a memory management circuit 602, a host interface 604, a memory interface 606, a buffer memory 608, a power management circuit 610, and an error checking and correcting circuit 612.

The memory management circuit 602 is configured to control overall operations of the memory control circuit unit 404. Specifically, the memory management circuit 602 has a plurality of control commands and the control commands are executed to perform various operations such as writing, reading and erasing data during operation of the memory storage apparatus 10.

In the present exemplary embodiment, the control commands of the memory management circuit 602 are implemented in form of firmware. For instance, the memory management circuit 602 has a microprocessor unit (not illustrated) and a read-only memory (not illustrated), and the control commands are burnt into the read-only memory. During operation of the memory storage apparatus 10, the control commands are executed by the microprocessor to perform operations of writing, reading or erasing data. It should be noted that, the operations performed by memory management circuit 602 described below may also be referred to as operations performed by the memory control circuit unit 404.

Figure 7:
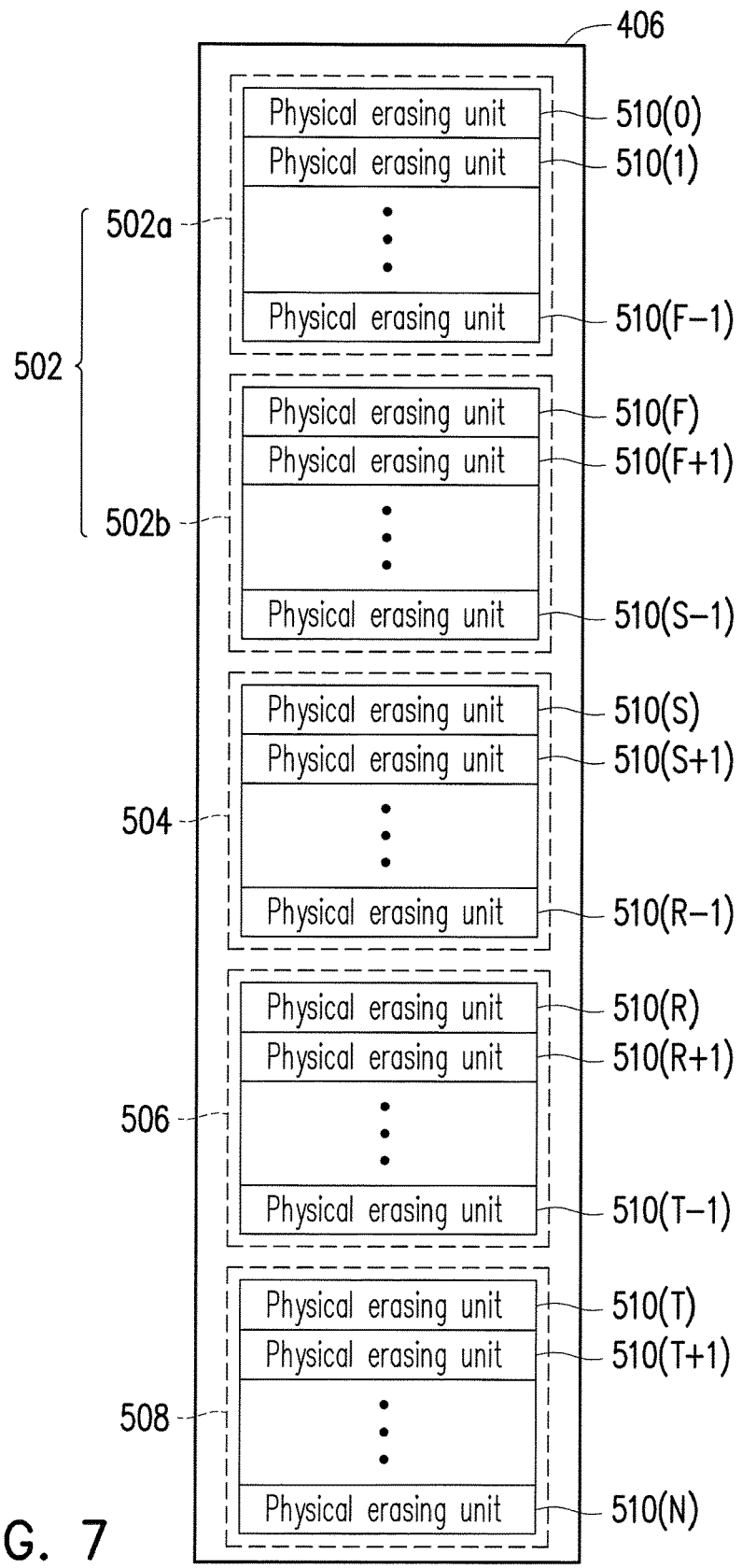
FIG. 7 and FIG. 8 are schematic diagrams illustrating an example of managing the physical erasing units according to an exemplary embodiment.
Figure 8:
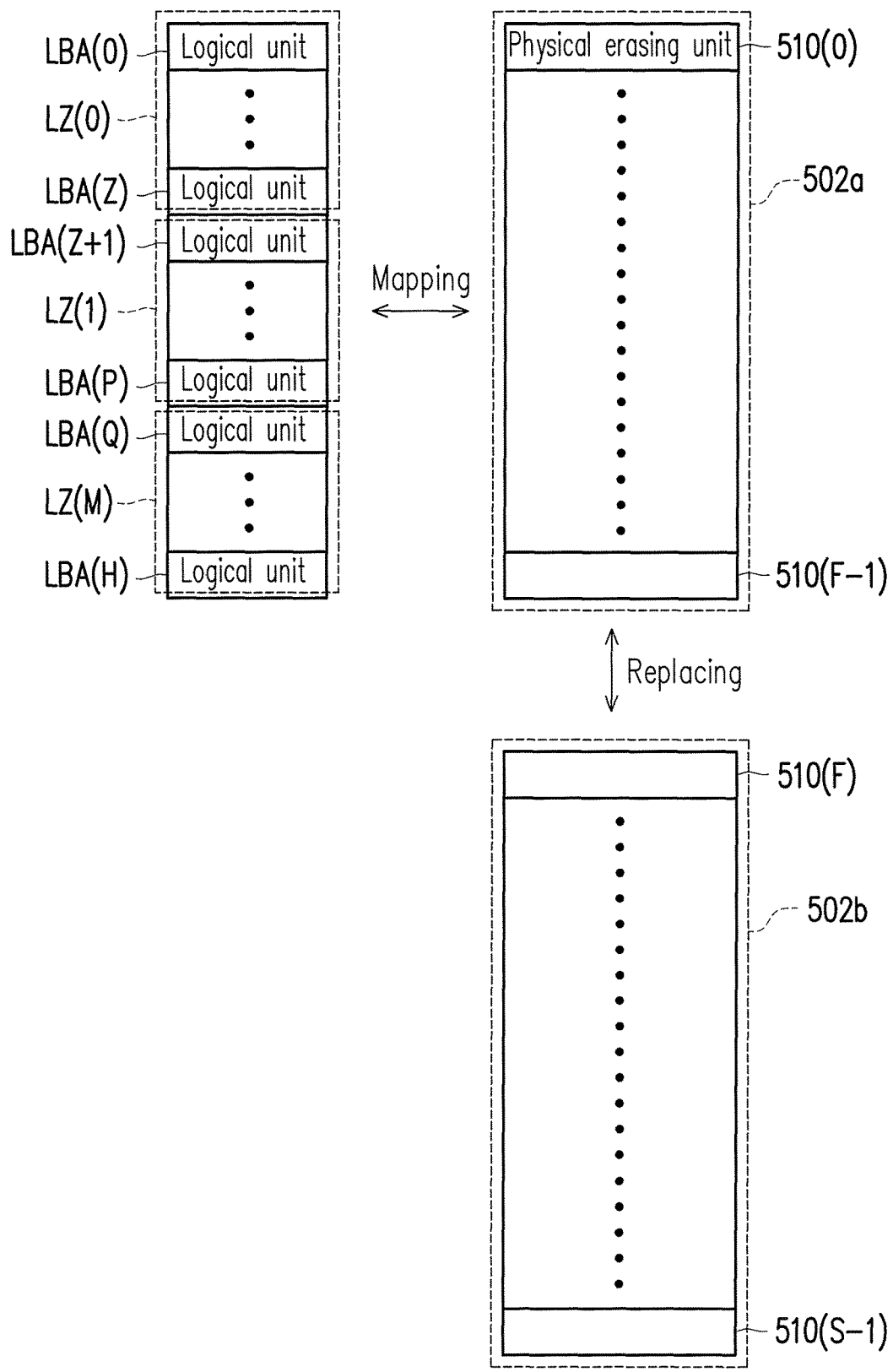

FIG. 7 and FIG. 8 are schematic diagrams illustrating an example of managing the physical erasing units according to an exemplary embodiment.

It should be understood that terms, such as "get", "retrieve", "group", "divide", "associate" and so forth, are logical concepts which describe operations in the physical erasing units of the rewritable non-volatile memory module 406. In other words, the physical erasing units of the rewritable non-volatile memory module are logically operated, but actual positions of the physical units of the rewritable non-volatile memory module are not changed.

Referring to FIG. 7, the memory management circuit 602 logically groups the physical erasing units 510(0) to 510(N) into a storage area 502 (also referred to as a first area), a temporary area 504 (also referred to as a second area), a system area 506 and a replacement area 508. It should be understood that, amounts of the physical erasing units in the storage area 502, the temporary area 504, the system area 506 and the replacement area 508 are different based on different memory specifications, which are not particularly limited by the present disclosure.

The physical erasing units logically belonging to the storage area 502 are configured to store data from the host system 11. Specifically, the storage area 502 includes a data area 502a and a spare area 502b. The physical erasing units of the data area 502a are regarded as the physical erasing units already stored with data, and the physical erasing units of the spare area 502b are configured to replace the physical erasing units of the data area 502a. In other words, when the write command and the data to be written are received from the host system 11, the memory management circuit 602 retrieves the physical erasing units from the spare area 502b, and writes the data into the retrieved physical erasing units in order to replace the physical erasing units in the data area 502a.

In the present exemplary embodiment, the memory management circuit 602 operates the physical erasing units belonging to the storage area 502 with a multi-page programming mode. The so-called "multi-page programming mode" refers to a writing mode for one memory cell storing a plurality of data bits. The multi-page programming mode is, for example, a Trinary level cell programming mode or similar modes. In the multi-page programming mode, all of the lower physical programming unit, the center physical erasing unit and the upper physical programming unit will be used for storing data. In other words, when writing data with the multi-page programming mode, the memory management circuit 602 programs the lower physical programming unit, the center physical programming unit and the upper physical programming unit of one physical programming unit group. It should be noted that, in an exemplary embodiment, when the multi-page programming mode is used to operate the physical erasing unit, the physical programming units in the same physical programming unit group are simultaneously or periodically programmed.

The physical erasing units logically belonging to the temporary area 504 is configured to temporally store data written from the host system 11. In the present exemplary embodiment, the memory management circuit 602 operates the physical erasing units belonging to the temporary area 504 with a single-page programming mode. Here, the so-called "single-page programming mode" refers to a writing mode for one memory cell storing only one bits. The single page programming mode is, for example, one of a SLC (Single Level Cell) programming mode, a lower physical programming mode, a mixture programming mode and a less level cell programming mode. More specifically, in the single level cell programming mode, one memory cell is only stored with data of one bit. In the lower physical programming mode, only the lower physical programming units are programmed, and the upper physical programming units corresponding to the lower physical programming units may not be programmed. In the mixture programming mode, valid data (or real data) are programmed into the lower physical programming units, and dummy data is programmed into the upper physical programming units corresponding to the lower physical programming units sorted with the valid data. In the less layer memory cell mode, one memory cell is stored with a first number of data bits. For example, the first number may be set to "1". In other words, in the single-page programming mode, the memory cells on one word line merely provides a space of one physical programming unit for storing data. In comparison with the physical erasing units operated with the multi-page programming mode, the operating life of the physical erasing units operated with the single-page programming mode is longer. Specifically, the writing or erasing count of each physical erasing unit is limited. When the writing or erasing count of one specific physical erasing unit exceeds a threshold, the specific physical erasing unit may be damaged and no longer available for data to be written. Here, the threshold corresponding to the physical erasing units operated in the multi-page programming mode is lower than the threshold corresponding to the physical erasing units operated in the single-page programming mode. In addition, a reliability of programming data into the physical erasing units with the single-page programming mode is higher than a reliability of programming data into the physical erasing units with the multi-page programming mode.

The physical erasing units logically belonging to the system area 506 are configured to record system data. For example, the system data includes a logical-to-physical address mapping table, information related to manufacturer and model of the rewritable non-volatile memory module, the number of physical erasing units in the rewritable non-volatile memory module, the number of the physical programming units in each physical erasing unit, and the like.

The physical erasing units logically belonging to the replacement area 508 are used in a bad physical erasing unit replacement procedure for replacing damaged physical erasing units. More specifically, if normal physical erasing units are still available in the replacement area 508 when the physical erasing units of the data area 502a are damaged, the memory management circuit 602 retrieves the normal physical erasing units from the replacement area 508 in order to replace the damaged physical erasing units.

Referring to FIG. 8, the memory management circuit 602 configures logical units LBA(0) to LBA(H) for mapping the physical erasing units of the data area 502a, wherein each of the logical units includes a plurality of logical sub-units for mapping to the corresponding physical programming units of the physical erasing units. Further, when the host system 11 intends to write the data into the logical units or update the data stored in the logical units, the memory management unit 602 retrieves one physical erasing unit from the spare area 502b for writing the data to replace the physical erasing unit of the data area 502a. In this exemplary embodiment, the logical sub-units may be logical pages or logical sectors.

In order to identify which of the physical erasing units is the data of each logical unit being stored to, the memory management circuit 602 records mapping relations between the logical units and the physical erasing units in the present exemplary embodiment. Further, when the host system 11 intends to access the data in the logical sub-unit, the memory management circuit 602 confirms the logical unit to which the logical sub-unit belongs, and accesses the data in the physical erasing unit mapped to said logical unit. For instance, in the present exemplary embodiment, the memory management circuit 602 may store a logical-to-physical address mapping table into the rewritable non-volatile memory module 406 for recording the physical erasing units mapped to each of the logical units, and the logical-to-physical address mapping table is loaded into the buffer memory 608 for maintenance when the memory management circuit 602 intends to access the data.

It is noted that in the following description, some terms may be replaced with corresponding abbreviations for ease of reading (seeing Table 1).

TABLE 1

| logical-to-physical address mapping table | L2P table |
|---|---|
| physical address-Logical address mapping table | P2L table |
| rewritable non-volatile memory module | RNVM module |
| physical erasing unit | PEU |
| physical programming unit | PPU |
| Logical erasing unit | LEU |
| logical programming unit | LPU |
| memory management circuit | MMC |
| memory control circuit unit | MCCU |

It should be noted that, the mapping table cannot record the mapping relation for all of the logical units because a capacity of the buffer memory 608 is limited. Therefore, in the present exemplary embodiment, the memory management unit 602 groups the logical units LBA(0) to LBA(H) into a plurality of logical zones LZ(0) to LZ(M), and configures one L2P table for each of the logical zones. In particular, when the memory management unit 602 intends to update the mapping relation for one specific logical unit, the L2P table corresponding to the logical zone to which the logical unit belongs is loaded into the buffer memory 608 for updating.

It is worth mentioning that, in the present exemplary embodiment, the size of one logical unit is identical to a capacity of one PEU operated with the multi-page programming mode. Accordingly, in the present exemplary embodiment, three PEUs of the temporary area 504 may then provide sufficient space for storing data of one logical unit.

In the present exemplary embodiment, after one specific PEU is grouped into the temporary area 504, the specific PEU can only be used by the temporary area 504 rather than being used together with the PEUs of the storage area 502. In other words, the MMC 602 operates the PEUs of the storage area 502 and the temporary area 504, separately. For example, after one PEU is grouped into the temporary area 504, the MMC 602 operates such PEU with the single-page programming mode until the specific PEU is damaged.

In the present exemplary embodiment, there are two methods for programming data into the storage area 502 including one that takes a pathway via the temporary area 504 for writing data and another one that does not take the pathway via the temporary area 504 for writing data. For example, after receiving the write command from the host system 11, the MMC 602 may temporarily store the data into the temporary area 504 with the single-page programming mode, and then move the data from the temporary area 504 to the storage area 502 with the multi-page programming mode. Alternatively, the MMC 602 may also directly write the data into the storage area 502 with the multi-page programming mode.

Figure 9:
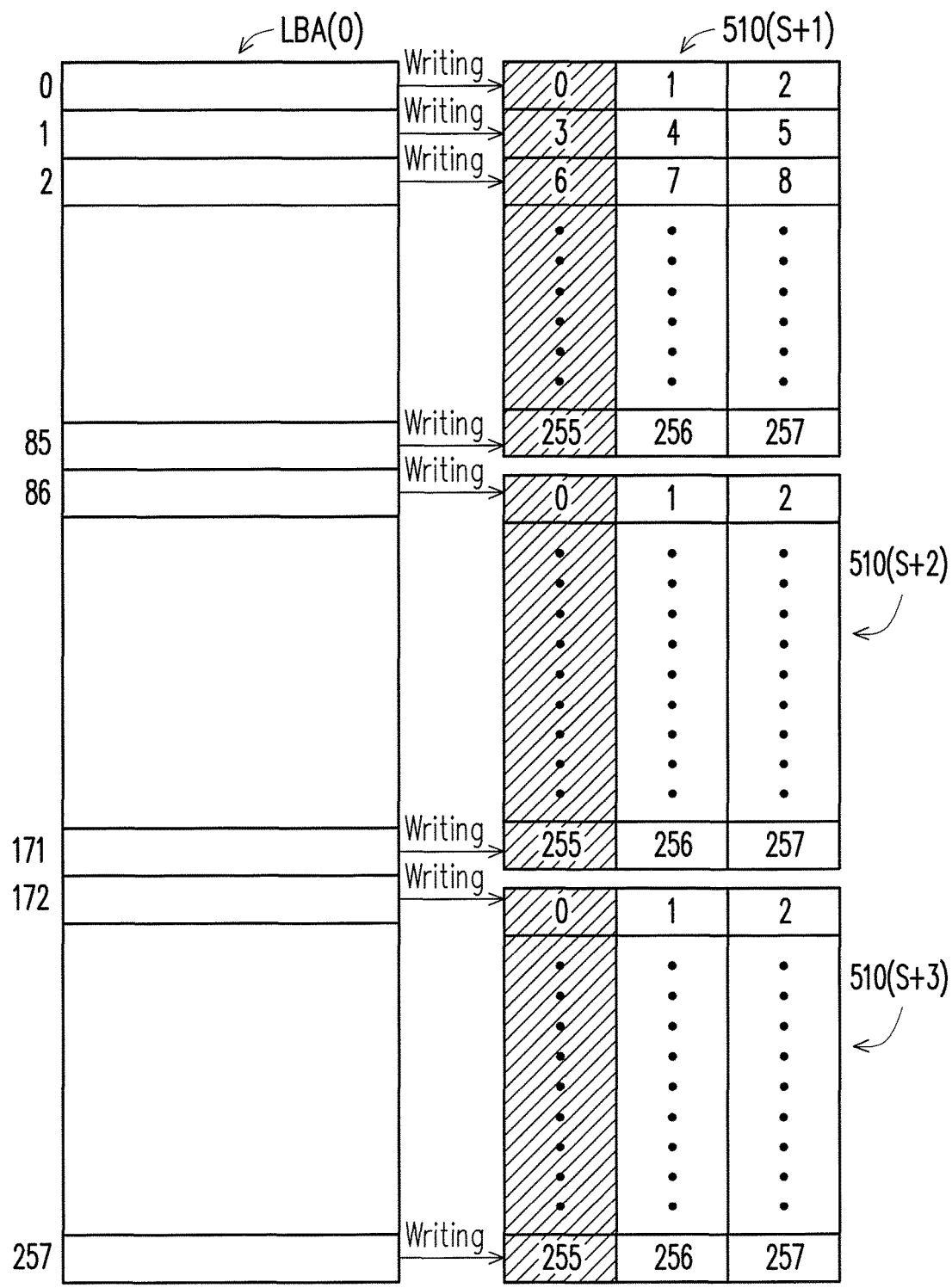
FIG. 9 and FIG. 10 are schematic diagrams illustrating an example of temporarily storing data into the temporary area with the single-page programming mode and then writing the data from the temporary area into the storage area with the multi-page programming mode according to an exemplary embodiment.
Figure 10:
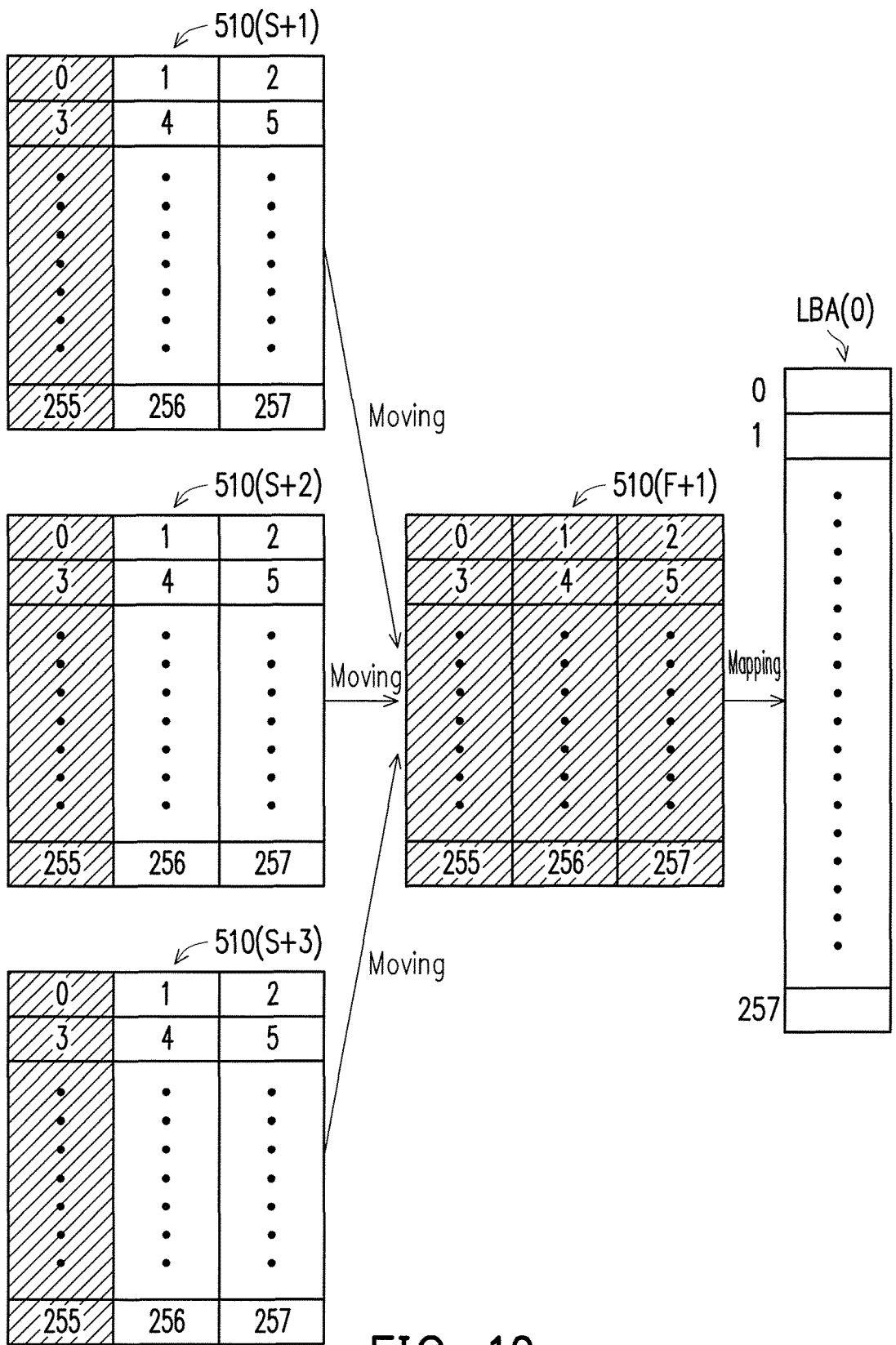

FIG. 9 and FIG. 10 are schematic diagrams illustrating an example of temporarily storing data into the temporary area with the single-page programming mode and then writing the data from the temporary area into the storage area with the multi-page programming mode according to an exemplary embodiment.

Referring to FIG. 9, when the memory storage apparatus 10 receives the write command which instructs to store updated data to $0^{th}$ to $257^{th}$ logical sub-units of the logical unit LBA(0) from the host system 11, the MMC 602 retrieves three PEUs 510(S+1), 510(S+2) and 510(S+3) from the temporary area 504 to serve as temporary area active units corresponding to the logical unit LBA(0), and uses the temporary area active unit 510(S+1), the temporary area active unit 510(S+2) and the temporary area active unit 510(S+3) for writing the updated data belonging to the logical unit LBA(0). Here, the so-called "active unit" refers to a condition where one PEU is already selected for writing data (i.e., a first PPU of the PEU is already written with data), but such PEU is not fully written (i.e., part of the PPUs of such PEU is not written with data). The "temporary area active unit" refers to a PEU that is already selected from the temporary area 504 for writing data but is not fully written (i.e., a PEU having only part of PPUs being programmed).

For example, the MMC 602 gives a command sequence to write the updated data to be stored into the $0^{th}$ to $85^{th}$ logical sub-units of the logical unit LBA(0) sequentially into the lower PPUs of the temporary area active unit 510(S+1), write the updated data to be stored into the $86^{th}$ to $171^{st}$ logical sub-units of the logical unit LBA(0) sequentially into the lower PPUs of the temporary area active unit 510(S+2) and write the updated data to be stored into the $172^{nd}$ to $257^{th}$ logical sub-units of the logical unit LBA(0) sequentially into the lower PPUs of the temporary area active unit 510(S+3). It is worth mentioning that, when a massive amount of data is continuously written, a cache programming command may be utilized for writing data according to a page order of the temporary area active unit 510(S+1), the temporary area active unit 510(S+2) and the temporary area active unit 510(S+3), so as to effectively improve the speed for writing data. In another exemplary embodiment, the MMC 602 reorganizes or rearranges the updated data to be stored into each of the logical sub-units of the logical unit LBA(0) before simultaneously writing the reorganized or rearranged data into the lower PPUs of the temporary area active unit 510(S+1), the lower PPUs of the temporary area active unit 510(S+2) and the lower PPUs of the temporary area active unit 510(S+3).

Referring to FIG. 10, after the data of all the logical sub-units of the logical unit are temporarily stored into the temporary area active unit 510(S+1), the temporary area active unit 510(S+2) and the temporary area active unit 510(S+3), the MMC 602 retrieves the PEU 510(F+1) (hereinafter, referred to as a third PEU) from the spare area 502*b* to serve as a storage area active unit. Specifically, the MMC 602 selects one empty PEU or one specific PEU stored with invalid data from the spare area 502*b* to serve as the storage area active unit. Particularly, if the retrieved PEU is the specific PEU stored with the invalid data, the MMC 602 first performs an erasing operation on the specific PEU. In other words, the invalid data of the PEU must be erased first.

Thereafter, the MMC 602 gives a command sequence to copy the valid data belonging to the $0^{th}$ to $85^{th}$ logical sub-units of the logical unit LBA(0) from the lower PPUs of the temporary area active unit 510(S+1) to a corresponding page (e.g., $0^{th}$ to 85th PPUs) of the PEU 510(F+1) currently serving as the storage area active unit. Here, the so-called "storage area active unit" refers to a PEU that is already selected from the storage area 502 for writing data but is not fully written (i.e., the PEU having only part of PPUs being programmed). Next, the MMC 602 gives a command sequence to copy the valid data belonging to the $86^{th}$ to $171^{st}$ logical sub-units of the logical unit LBA(0) from the lower PPUs of the temporary area active unit 510(S+2) to a corresponding page (e.g., $86^{th}$ to $171^{st}$ PPUs) of the PEU 510(F+1) currently serving as the storage area active unit. Then, the MMC 602 gives a command sequence to copy the valid data belonging to the $172^{nd}$ to $257^{th}$ logical sub-units of the logical unit LBA(0) from the lower PPUs of the temporary area active unit 510(S+3) to a corresponding page (e.g., $172^{nd}$ to $257^{th}$ PPUs) of the PEU 510(F+1) currently serving as the storage area active unit.

It should be noted that, as described above, because the PEUs associated to the data area 502*a* are operated with the multi-page programming mode, writing to the PEU 510(F+1) is simultaneously or periodically programmed using the PPU group as a unit. Specifically, in an exemplary embodiment, the $0^{th}$, $1^{st}$ and $2^{nd}$ PPUs of the PEU 510(F+1) are simultaneously programmed for writing the data belonging to the $0^{th}$, $1^{st}$ and $2^{nd}$ logical sub-units of the logical unit LBA(0); the $3^{rd}$, $4^{th}$ and $5^{th}$ PPUs of the PEU 510(F+1) are simultaneously programmed for writing the data belonging to the $3^{rd}$, $4^{th}$ and $5^{th}$ logical sub-units of the logical unit LBA(0); and by analogy, the data of the other logical sub-units are all written into the PEU 510(F+1) using the PPU group as a unit.

Lastly, the MMC 602 maps the logical unit LBA(0) to the PEU 510(F+1) in the L2P table, resets the PEUs 510(S+1) to 510(S+3) not to be the temporary area active unit and performs an erasing operation on the PEUs 510(S+1) to 510(S+3). In other words, when the next write command is executed, the empty temporary PEUs 510(S+1) to 510(S+3) may be selected to serve as the temporary area again.

Figure 11:
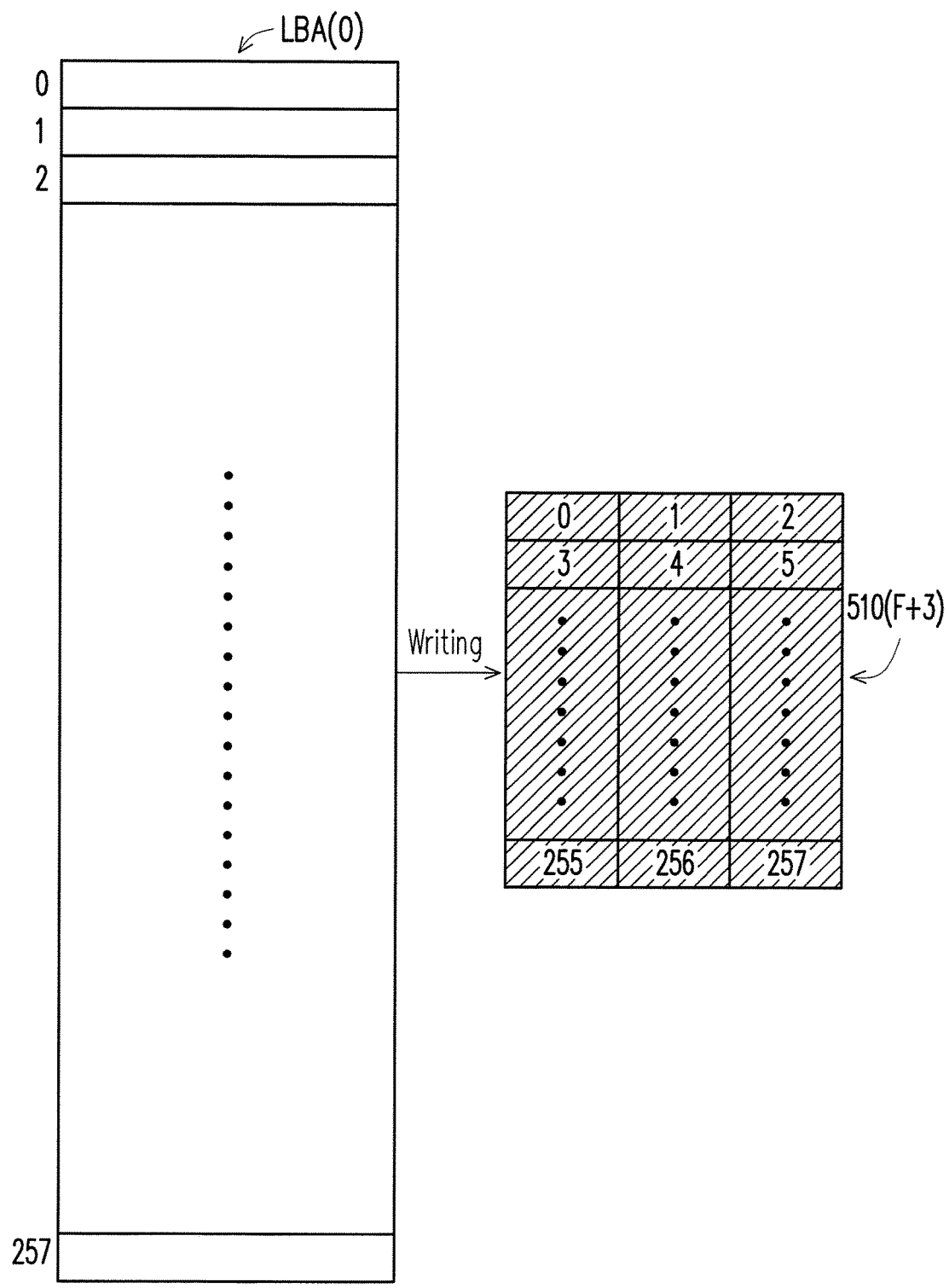
FIG. 11 is a schematic diagram illustrating an example of writing data into the storage area with the multi-page programming mode according to an exemplary embodiment.

FIG. 11 is a schematic diagram illustrating an example of writing data into the storage area with the multi-page programming mode according to an exemplary embodiment.

Referring to FIG. 11, when the memory storage apparatus 10 receives the write command which instructs to store updated data to $0^{th}$ to $257^{th}$ logical sub-units of the logical unit LBA(0) from the host system 11, the MMC 602 retrieves the PEU 510(F+3) (hereinafter, referred to as a fourth PEU) from the spare area 502*b* to serve as the storage area active unit. Specifically, the MMC 602 selects one empty PEU or one specific PEU stored with invalid data from the spare area 502*b* to serve as the storage area active unit. Particularly, if the retrieved PEU is the specific PEU stored with the invalid data, the MMC 602 first performs an erasing operation on the specific PEU. In other words, the invalid data of the PEU must be erased first.

Thereafter, the MMC 602 gives a command sequence to write the received data into the PEU 510(F+3) currently serving as the storage area active unit with the multi-page programming mode. Similarly, the PEU 510(F+3) is simultaneously or periodically programmed using the PPU group as a unit.

It is worth mentioning that, the valid data in the PPUs of the data area 502*a* may become the invalid data because the corresponding updated data is written into another PPU of the storage area 502 or the temporary area 504. As such, because there can be many PPUs stored with the invalid data in the data area 502*a*, the MMC 602 performs a valid data merging operation in order to recycle the PPUs storing the invalid data. For example, when the memory storage apparatus 10 is in an idle state for a period of time (e.g., no command is received from the host system 11 within 30 seconds) or when a number of the empty PEUs in the spare area 502*b* is less than a preset threshold, the MMC 602 performs the valid data merging operation on the valid data in the storage area 502 in order to release the empty PEUs. For instance, the predetermined threshold is set to 3. Nevertheless, it should be understood that the invention is not limited thereto, and the predetermined threshold may be other appropriate values.

In the present exemplary embodiment, the MMC 602 can perform the valid data merging operation in the storage area 502 (hereinafter, referred to as a first data merging operation) or perform the valid data merging operation between the storage area 502 and the temporary area 504 (hereinafter, referred to as a second valid data merging operation).

Figure 12:
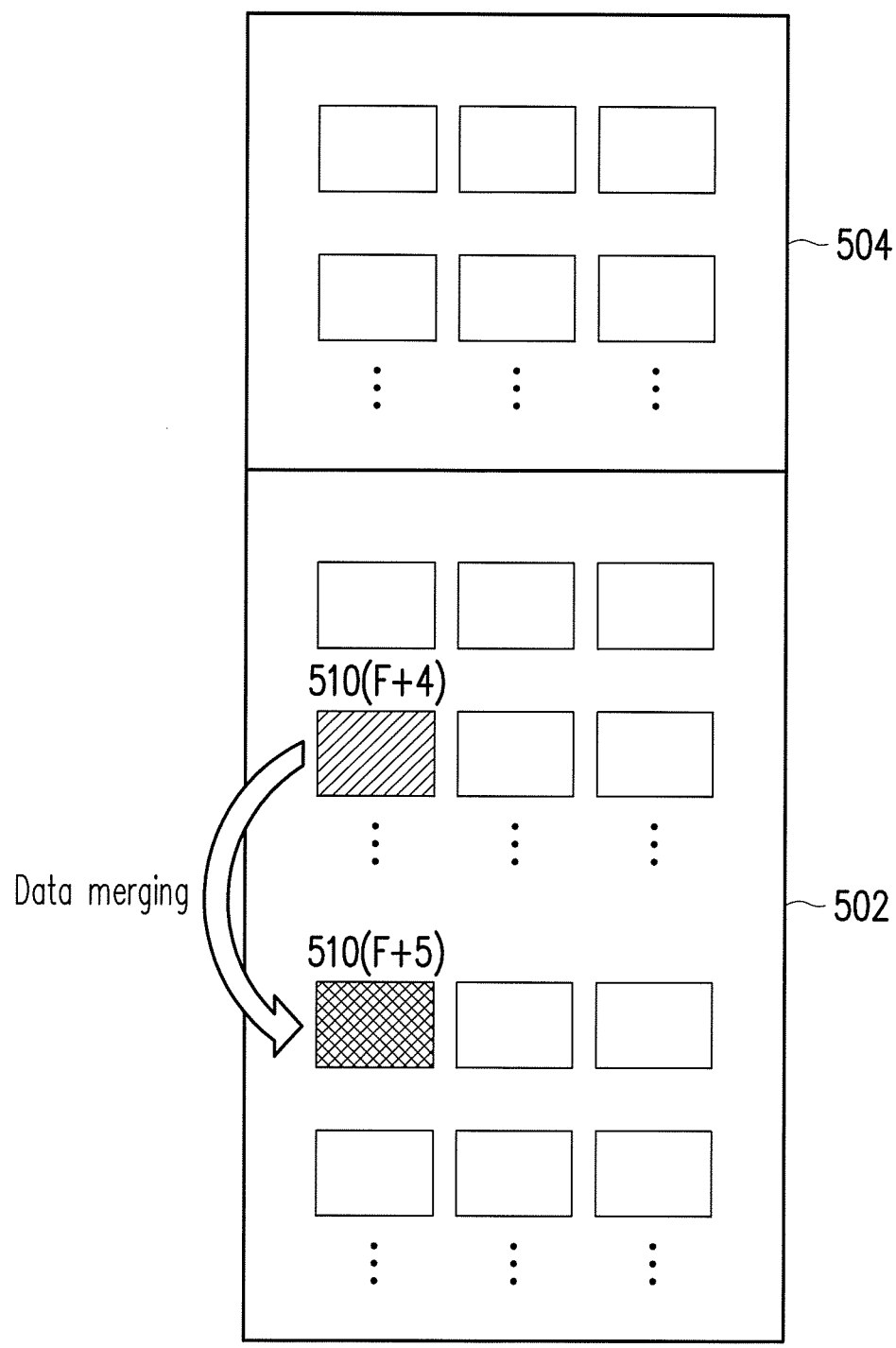
FIG. 12 is a schematic diagram illustrating the first valid data merging operation performed on the physical erasing units in the storage area according to an exemplary embodiment.

FIG. 12 is a schematic diagram illustrating the first valid data merging operation performed on the PEUs in the storage area according to an exemplary embodiment.

Referring to FIG. 12, when the MMC 602 intends to perform the data merging operation on the PEUs of the storage area 502 (e.g., when the data merging operation is periodically performed on the PEUs of the storage area 502 or when the host system 11 is in the idle state), the MMC 602 selects the PEU 510(F+5) (hereinafter, referred to as a first PEU) from the data area 502*a* of the storage area 502 to serve as the storage area active unit and gives a command sequence to copy the valid data in the PEU 510(F+4) (hereinafter, referred to as a second PEU) to the PEU 510(F+5) set as the storage area active unit.

Specifically, during the data merging operation, the MMC 602 reads the valid data from the lower, center and upper PPUs of the PEU 510(F+4), and writes the read valid data into the lower, center and upper PPUs of the PEU 510(F+5) currently set as the storage area active unit (i.e., the operation of "Data merging" as shown in FIG. 12). Then, the MMC 602 maps the original logical sub-units to which the valid data belongs in the PEU 510(F+4) to the PPUs of the PEU 510(F+5), and performs the erasing operation on the PEU 510(F+4) in order to release space of the PEU 510(F+4).

Figure 13:
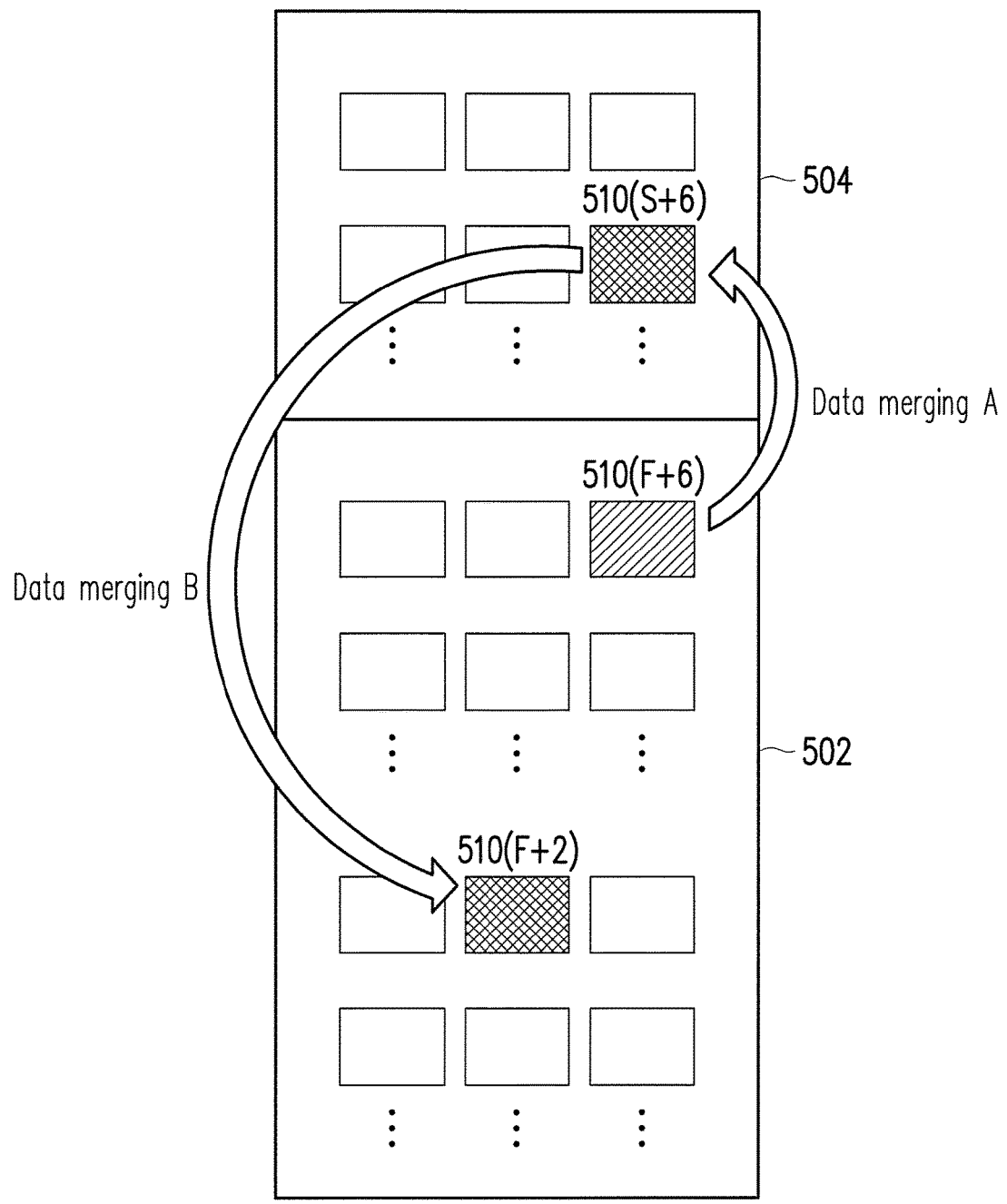
FIG. 13 is a schematic diagram illustrating the second valid data merging operation performed on the physical erasing units in the storage area according to another exemplary embodiment.

FIG. 13 is a schematic diagram illustrating the second valid data merging operation performed on the PEUs in the storage area according to another exemplary embodiment.

Referring to FIG. 13, when the MMC 602 intends to perform the data merging operation on the PEUs of the data area 502*a* of the storage area 502 (e.g., when the data merging operation is periodically performed on the PEUs of the data area 502*a*, or when the host system 11 is in the idle state, or when none of the PEUs of the data area 502*a* has sufficient space), the MMC 602 selects the PEU 510(F+6) (hereinafter, referred to as a sixth PEU) from the data area 502*a* of the storage area 502, selects the PEU 510(S+6)

(hereinafter, referred to as a fifth PEU) from the temporary area 504 to serve as the temporary area active unit for the valid data merging operation, and gives a command sequence to copy the valid data in the PEU 510(F+6) to the PEU 510(S+6). Specifically, the MMC 602 reads the valid data from the lower, center and upper PPUs of the PEU 510(F+6), writes the read valid data into the lower PPUs of the PEU 510(S+6) (i.e., this is the operation of "Data merging A" as shown in FIG. 14), and performs the erasing operation on the PEU 510(F+6) in order to release space of the PEU 510(F+6).

Figure 14:
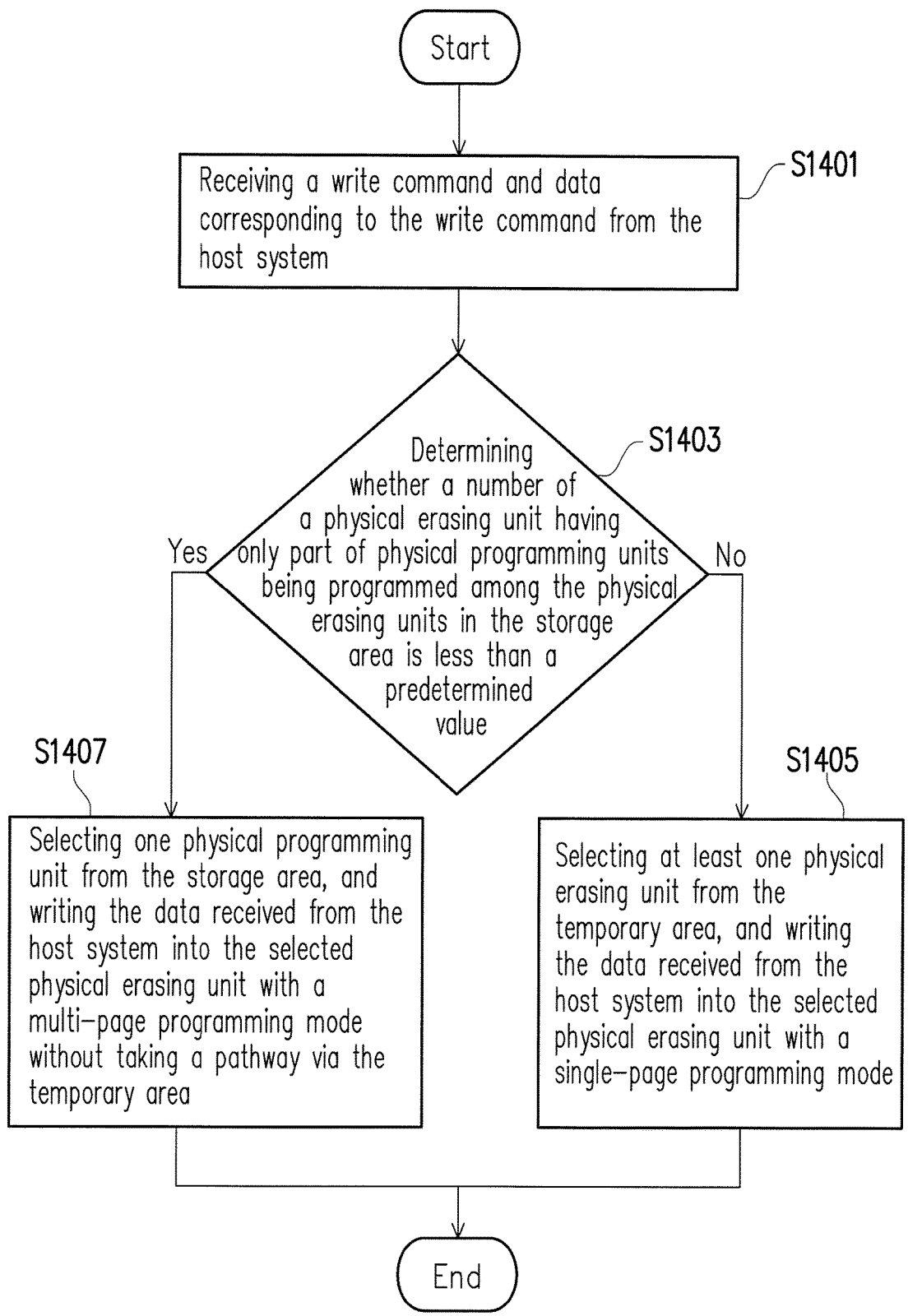
FIG. 14 is a flowchart of a data writing method according to an exemplary embodiment.

Then, the MMC 602 selects one PEU 510(F+2) (hereinafter, referred to as a seventh PEU) from the spare area 502b of the storage area 502 to serve as the storage area active unit, gives a command sequence to read the valid data from the lower PPUs of the PEU 510(S+6), gives a command sequence to write the read valid data into the lower, center and upper PPUs of the PEU 510(F+2) currently serving as the storage area active unit (i.e., the operation of "Data merging B" as shown in FIG. 14), resets the PEU 510(S+6) not to be the temporary area active unit and perform an erasing operation on the PEU 510(S+6). Then, the MMC 602 maps the logical sub-units to which the valid data belongs to the PPUs of the PEU 510(F+2). In the example of FIG. 13, the valid data in the PEU 510(F+6) of the data area 502a is first copied to the PEU 510(S+6) of the temporary area 504, and then the copied data is copied from the PEU 510(S+6) to the PEU 510(F+2) of the spare area 502b. Accordingly, all the data in the PEU 510(F+6) of the data area 502a become the invalid data, so the PEU 510(F+6) may be released after the erasing operation is performed thereto (i.e., the PEU 510(F+6) is associated to the spare area 502b).

It is noted that, as described above, a writing speed of the multi-page programming mode is lower than a writing speed of the single-page programming mode. During the data writing operation as shown in FIG. 9 to FIG. 11 and the data merging operation as shown in FIG. 12 to FIG. 13, the MMC 602 restricts a number of the PEU serving as the storage area active unit to be not greater than a predetermined value but does not restrict a number of the PEU serving as the temporary area active unit. As such, performance of the memory storage apparatus 10 may be improved. For example, in the present exemplary embodiment, the MMC 602 may restrict the number of the PEU serving as the storage area active unit to be not greater than 1. In other words, there can only be one PEU of the storage area 502 serving as the storage area active unit at the same time.

Specifically, when the host system 11 receives the write command and data corresponding to the write command, the MMC 602 determines whether the number of the PEU having only part of the PPUs being programmed in the storage area 502 is less than the predetermined value. If the number of the PEU having only part of PPUs being programmed in the storage area 502 is not less than the predetermined value, the MMC 602 temporarily stores the data received form the host system 11 into the temporary area 504 using the method shown in FIG. 9 instead of setting another PEU of the storage area 502 as the storage area active unit for writing data. Similarly, in the present exemplary embodiment, when it is required to perform the valid data merging operation in the storage area 502, the MMC 602 determines whether the number of the PEU having only part of the PPUs being programmed in the storage area 502 is less than the predetermined value. If the number of the PEU having only part of PPUs being programmed in the storage area 502 is not less than the predetermined value, the MMC 602 copies the valid data to the temporary area active unit of the temporary area 504 using the method shown in FIG. 13. Then, when the PEU is reset not to be the storage area active unit, the MMC 602 moves the data from the temporary area 504 to the storage area 502.

FIG. 14 is a flowchart of a data writing method according to an exemplary embodiment.

Referring to FIG. 14, in step S1401, the MMC 602 receives a write command and data corresponding to the write command from the host system 11.

In step S1403, the MMC 602 determines whether the number of a PEU having only part of PPUs being programmed among the PEUs in the storage area 502 is less than a predetermined value.

If the number of the PEU having only part of the PPUs being programmed in the storage area 502 is not less than the predetermined value, in step S1405, the MMC 602 selects at least one PEU from the temporary area 504, and writes the data received from the host system 11 into the selected PEU with a single-page programming mode. The operation for temporarily storing the data into the temporary area 504 has been described in detail with reference to FIG. 9 above, which is not repeated hereinafter.

If the number of the PEU having only part of the PPUs in the storage area 502 is less than the predetermined value, in step S1407, the MMC 602 selects one PPU from the storage area 502, and writes the data received from the host system 11 into the selected PEU with a multi-page programming mode without taking a pathway via the temporary area 504. For example, in step S1407, the MMC 602 directly writes the data from the buffer memory 608 into the PEU selected to serve as the storage area active unit from the storage area 502 by using the operation shown in FIG. 11.

Figure 15:
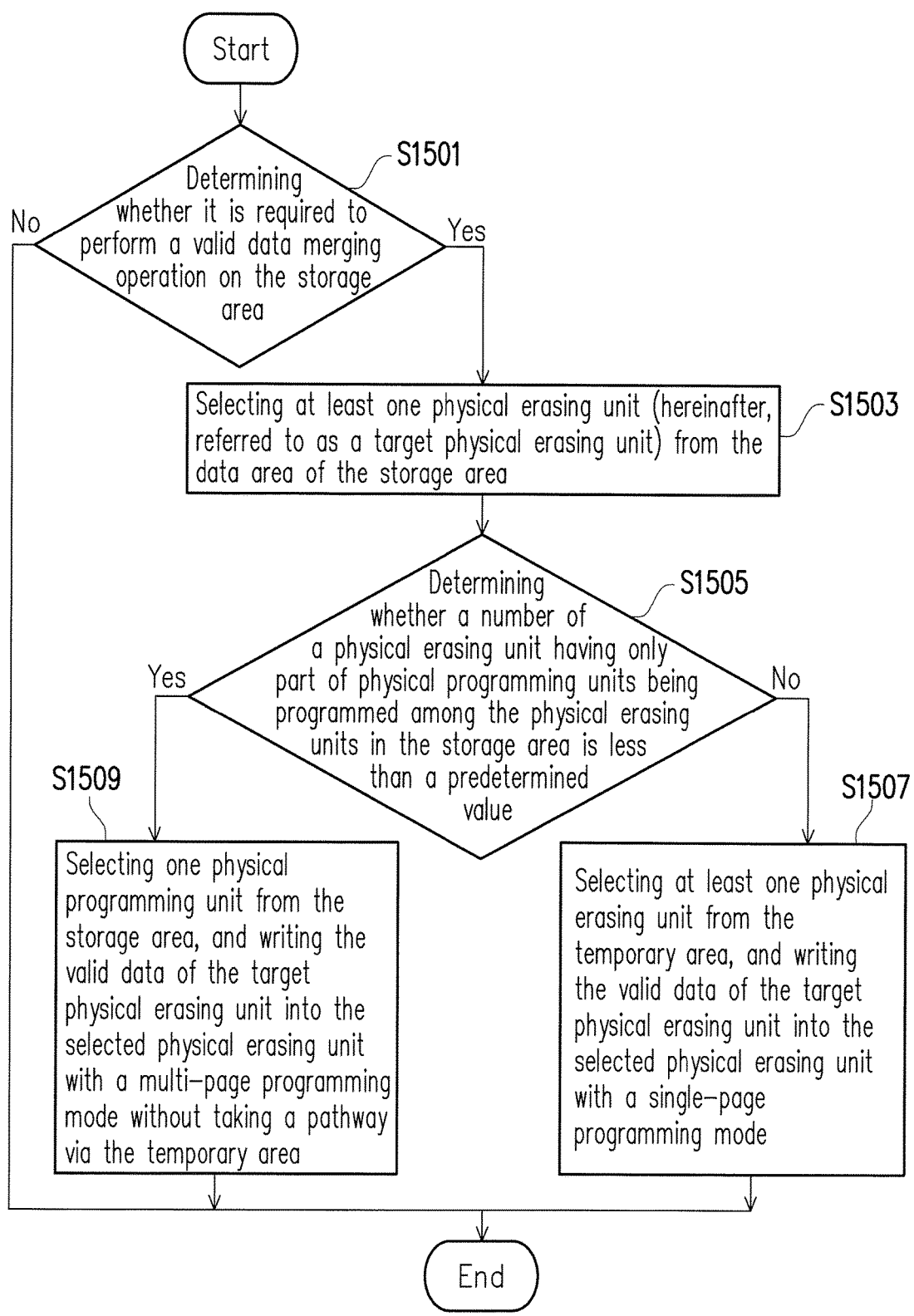
FIG. 15 is a flowchart of a data writing method according to another exemplary embodiment.

FIG. 15 is a flowchart of a data writing method according to another exemplary embodiment.

In step S1501, the MMC 602 determines whether it is required to perform a valid data merging operation on the storage area 502.

If it is not required to perform the valid data merging operation, the process flow of FIG. 16 ends.

If it is required to perform the valid data merging operation, in step S1503, the MMC 602 selects at least one PEU (hereinafter, referred to as a target PEU) from the data area 502a of the storage area 502.

In step S1505, the MMC 602 determines whether the number of a PEU having only part of PPUs being programmed in the storage area 502 is less than a predetermined value.

If the number of the PEU having only part of the PPUs being programmed in the storage area 502 is not less than the predetermined value, in step S1507, the MMC 602 selects at least one PEU from the temporary area 504, and writes the valid data of the target PEU into the selected PEU with a single-page programming mode. The valid data merging operation for temporarily storing the valid data into the temporary area 504 has been described in detail with reference to FIG. 14 above, which is not repeated hereinafter.

If the number of the PEU having only part of the PPUs in the storage area 502 is less than the predetermined value, in step S1509, the MMC 602 selects one PPU from the storage area 502, and writes the valid data of the target PEU into the selected PEU with a multi-page programming mode without taking a pathway via the temporary area 504. For example, in step S1509, with use of the multi-page programming mode, the MMC 602 copies the valid data from the target PEU to the PEU selected to serve as the storage area active unit in the storage area 502 (the operation as shown in FIG. 13).

In summary, when the writing operation and the valid data merging method are performed with use of the data writing method, the MCCU and the memory storage apparatus according to the exemplary embodiments of the invention, whether the data is directly programmed into the storage area or temporarily stored into the temporary area may be determined according to the number of the PEU serving as the storage area active unit. As a result, the speed and the reliability for programming data may be effectively improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A data writing method for a rewritable non-volatile memory module, wherein the rewritable non-volatile memory module comprises a plurality of physical erasing units, the physical erasing units are grouped at least into a first area and a second area, the number of data bits stored by each memory cell in the physical erasing units of the second area is less than the number of data bits stored by each memory cell in the physical erasing units of the first area, and the data writing method comprises:
   receiving first data; and
   writing the first data into at least one physical erasing unit among the physical erasing units of the second area if the number of physical erasing units having only part of physical programming units being programmed among the physical erasing units of the first area is not less than a predetermined value.

2. The data writing method of claim 1, further comprising:
   determining whether the number of physical erasing units having only part of physical programming units being programmed among the physical erasing units of the first area is less than the predetermined value.

3. The data writing method of claim 1, further comprising:
   writing the first data into a physical erasing unit among the physical erasing units of the first area if the number of the physical erasing unit having only part of physical programming units being programmed among the physical erasing units of the first area is less than the predetermined value.

4. The data writing method of claim 1, further comprising:
   selecting a first physical erasing unit among the physical erasing units of the first area to perform a first valid data merging operation, and copying valid data in at least one second physical erasing unit among the physical erasing units of the first area to the first physical erasing unit in the first valid data merging operation,
   wherein the first physical erasing unit is determined as the physical erasing unit having only part of physical programming units being programmed if the first physical erasing unit is not fully written.

5. The data writing method of claim 4, further comprising:
   selecting a third physical erasing unit from among the physical erasing units of the first area if the first physical erasing unit is fully written;
   copying the first data in the at least one physical erasing unit of the second area to the third physical erasing unit; and
   performing an erasing operation on the at least one physical erasing unit of the second area.

6. The data writing method of claim 1, further comprising:
   before the first data is received, receiving a write command and second data corresponding to the write command from a host system;
   selecting a fourth physical erasing unit from among the physical erasing units of the first area; and
   writing the second data into the fourth physical erasing unit,
   wherein the fourth physical erasing unit is determined as the physical erasing unit having only part of physical programming units being programmed if the fourth physical erasing unit is not fully written.

7. The data writing method of claim 6, further comprising:
   selecting a plurality of fifth physical erasing units among the physical erasing units of the second area to perform a second valid data merging operation;
   copying valid data in at least one sixth physical erasing unit among the physical erasing units of the first area to the fifth physical erasing units, selecting a seventh physical erasing unit among the physical erasing units of the first area, and copying the valid data in the fifth physical erasing units to the seventh physical erasing unit in the second valid data merging operation; and
   performing an erasing operation on the fifth physical erasing units after copying the valid data in the fifth physical erasing units to the seventh physical erasing unit.

8. A memory control circuit unit for controlling a rewritable non-volatile memory module, wherein the rewritable non-volatile memory module comprises a plurality of physical erasing units, the physical erasing units are grouped at least into a first area and a second area, the number of data bits stored by each memory cell in the physical erasing units of the second area is less than the number of data bits stored by each memory cell in the physical erasing units of the first area, the memory control circuit unit comprising:
   a host interface, configured to couple to a host system;
   a memory interface, configured to couple to the rewritable non-volatile memory module; and
   a memory management circuit, coupled to the host interface and the memory interface,
   wherein the memory management circuit is configured to receive first data,
   wherein the memory management circuit is further configured to write the first data into at least one physical erasing unit among the physical erasing units of the second area if the number of physical erasing units having only part of physical programming units being programmed among the physical erasing units of the first area is not less than a predetermined value,
   wherein the memory management circuit is further configured to write the first data into a physical erasing unit among the physical erasing units of the first area if the number of the physical erasing unit having only part of physical programming units being programmed among the physical erasing units of the first area is less than the predetermined value.

9. The memory control circuit unit of claim 8,
   wherein the memory management circuit is further configured to determine whether the number of the physical erasing units having only part of physical programming units being programmed among the physical erasing units of the first area is less than the predetermined value.

10. The memory control circuit unit of claim 8,
wherein the memory management circuit is further configured to select a first physical erasing unit among the physical erasing units of the first area to perform a first valid data merging operation, and give a command sequence for copying valid data in at least one second physical erasing unit among the physical erasing units of the first area to the first physical erasing unit in the first valid data merging operation,
wherein the first physical erasing unit is determined as the physical erasing unit having only part of physical programming units being programmed if the first physical erasing unit is not fully written.

11. The memory control circuit unit of claim 10,
wherein the memory management circuit is further configured to select a third physical erasing unit from among the physical erasing units of the first area if the first physical erasing unit is fully written, give another command sequence for copying the first data in the at least one physical erasing unit of the second area to the third physical erasing unit, and give another command sequence for performing an erasing operation on the at least one physical erasing unit of the second area.

12. The memory control circuit unit of claim 8,
wherein before the first data is received, the memory management circuit is further configured to receive a write command and second data corresponding to the write command from the host system, select a fourth physical erasing unit from among the physical erasing units of the first area, and give another command sequence for writing the second data into the fourth physical erasing unit,
wherein the fourth physical erasing unit is determined as the physical erasing unit having only part of physical programming units being programmed if the fourth physical erasing unit is not fully written.

13. The memory control circuit unit of claim 12,
wherein the memory management circuit is further configured to select a plurality of fifth physical erasing units among the physical erasing units of the second area to perform a second valid data merging operation,
wherein the memory management circuit is further configured to give another command sequence for copying valid data in at least one sixth physical erasing unit among the physical erasing units of the first area to the fifth physical erasing units, select a seventh physical erasing unit among the physical erasing units of the first area, and give another command sequence for copying the valid data in the fifth physical erasing units to the seventh physical erasing unit in the second valid data merging operation,
wherein the memory management circuit is further configured to give another command sequence for performing an erasing operation on the fifth physical erasing units after copying the valid data in the fifth physical erasing units to the seventh physical erasing unit.

14. A memory storage apparatus comprising a rewritable non-volatile memory module, wherein the rewritable non-volatile have a plurality of physical erasing units, the physical erasing units are grouped at least into a first area and a second area, the number of data bits stored by each memory cell in the physical erasing units of the second area is less than the number of data bits stored by each memory cell in the physical erasing units of the first area, the memory storage apparatus further comprising:

a connection interface unit, configured to couple to a host system; and
a memory control circuit unit, coupled to the connection interface unit and the rewritable non-volatile memory module,
wherein the memory control circuit unit is configured to receive first data,
wherein the memory control circuit unit is further configured to write the first data into at least one physical erasing unit among the physical erasing units of the second area if the number of physical erasing units having only part of physical programming units being programmed among the physical erasing units of the first area is not less than a predetermined value.

15. The memory storage apparatus of claim 14,
wherein the memory control circuit unit is further configured to determine whether the number of the physical erasing units having only part of physical programming units being programmed among the physical erasing units of the first area is less than the predetermined value.

16. The memory storage apparatus of claim 14,
wherein the memory control circuit unit is further configured to write the first data into a physical erasing unit among the physical erasing units of the first area if the number of the physical erasing unit having only part of physical programming units being programmed among the physical erasing units of the first area is less than the predetermined value.

17. The memory storage apparatus of claim 14,
wherein the memory control circuit unit is further configured to select a first physical erasing unit among the physical erasing units of the first area to perform a first valid data merging operation, and copy valid data in at least one second physical erasing unit among the physical erasing units of the first area to the first physical erasing unit in the first valid data merging operation,
wherein the first physical erasing unit is determined as the physical erasing unit having only part of physical programming units being programmed if the first physical erasing unit is not fully written.

18. The memory storage apparatus of claim 17,
wherein the memory control circuit unit is further configured to select a third physical erasing unit from among the physical erasing units of the first area if the first physical erasing unit is fully written, copy the first data in the at least one physical erasing unit of the second area to the third physical erasing unit, and perform an erasing operation on the at least one physical erasing unit of the second area.

19. The memory storage apparatus of claim 14,
wherein before the first data is received, the memory control circuit unit is further configured to
receive a write command and second data corresponding to the write command from a host system, select a fourth physical erasing unit from among the physical erasing units of the first area, and write the second data into the fourth physical erasing unit,
wherein the fourth physical erasing unit is determined as the physical erasing unit having only part of physical programming units being programmed if the fourth physical erasing unit is not fully written.

20. The memory storage apparatus of claim 19,
wherein the memory control circuit unit is further configured to select a plurality of fifth physical erasing units among the physical erasing units of the second area to perform a second valid data merging operation, wherein the memory control circuit unit copies valid data in at least one sixth physical erasing unit among the physical erasing units of the first area to the fifth physical erasing units, selects a seventh physical erasing unit among the physical erasing units of the first area, and copies the valid data in the fifth physical erasing units to the seventh physical erasing unit in the second valid data merging operation, wherein the memory control circuit unit performs an erasing operation on the fifth physical erasing units after copying the valid data in the fifth physical erasing units to the seventh physical erasing unit.

21. A data writing method for a rewritable non-volatile memory module, wherein the rewritable non-volatile memory module comprises a plurality of physical erasing units, the physical erasing units are grouped at least into a first area and a second area, the number of data bits stored by each memory cell in the physical erasing units of the second area is less than the number of data bits stored by each memory cell in the physical erasing units of the first area, and the data writing method comprises:

receiving first data;

writing the first data into one physical erasing unit among the physical erasing units of the first area without taking a pathway via the second area if the number of a physical erasing unit having only part of physical programming units being programmed among the physical erasing units of the first area is less than a predetermined value; and writing the first data into at least one physical erasing unit among the physical erasing units of the second area if the number of the physical erasing unit having only part of physical programming units being programmed among the physical erasing units of the first area is not less than the predetermined value.

22. A memory storage apparatus, comprising:

a connection interface unit, configured to couple to a host system;

a rewritable non-volatile memory module having a plurality of physical erasing units; and a memory control circuit unit, coupled to the connection interface unit and the rewritable non-volatile memory module, wherein the memory control circuit unit is configured to group the physical erasing units at least into a first area and a second area, wherein the number of data bits stored by each memory cell in the physical erasing units of the second area is less than the number of data bits stored by each memory cell in the physical erasing units of the first area, wherein the memory control circuit unit is further configured to receive first data, wherein the memory control circuit unit writes the first data into one physical erasing unit among the physical erasing units of the first area without taking a pathway via the second area if the number of a physical erasing unit having only part of physical programming units being programmed among the physical erasing units of the first area is less than a predetermined value, wherein the memory control circuit unit is further configured to write the first data into at least one physical erasing unit among the physical erasing units of the second area if the number of the physical erasing unit having only part of physical programming units being programmed among the physical erasing units of the first area is not less than the predetermined value.

* * * * *